(12) United States Patent
Onushkin et al.

(10) Patent No.: US 8,723,206 B2
(45) Date of Patent: May 13, 2014

(54) SEMICONDUCTOR LIGHT EMITTING DEVICE WITH CONTACT HOLE PASSING THROUGH ACTIVE LAYER

(75) Inventors: Grigory Onushkin, Gyunggi-do (KR); Oleg Ledyaev, Gyunggi-do (KR); Jong Hoon Lim, Gyunggi-do (KR); Joong Kon Son, Seoul (KR); Pun Jae Choi, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 172 days.

(21) Appl. No.: 13/228,977

(22) Filed: Sep. 9, 2011

(65) Prior Publication Data

US 2013/0062638 A1    Mar. 14, 2013

(51) Int. Cl.
*H01L 33/00* (2010.01)
(52) U.S. Cl.
USPC ............. 257/98; 257/E33.062; 257/E33.072
(58) Field of Classification Search
USPC .............................. 257/98, E33.062, E33.072
See application file for complete search history.

(56) References Cited

U.S. PATENT DOCUMENTS

| | | | |
|---|---|---|---|
| 7,034,340 B2 * | 4/2006 | Yukimoto | 257/88 |
| 2004/0206970 A1 | 10/2004 | Martin | |
| 2006/0163604 A1 | 7/2006 | Shin et al. | |
| 2010/0252840 A1 | 10/2010 | Ibbetson et al. | |
| 2011/0260205 A1 | 10/2011 | Moosburger et al. | |
| 2011/0272728 A1 | 11/2011 | Rode et al. | |

FOREIGN PATENT DOCUMENTS

| | | |
|---|---|---|
| DE | 10 2008 022 942 A1 | 11/2009 |
| DE | 10 2009 006 177 A | 6/2010 |
| KR | 10-0872301 B1 | 11/2008 |
| KR | 10-0891761 B1 | 3/2009 |

OTHER PUBLICATIONS

Partial European Search Report, issued in European Patent Application No. 11182500.6, dated Mar. 9, 2012.
Extended European Search Report issued in European Application No. 11182500.6 issued on Jun. 14, 2012.

* cited by examiner

*Primary Examiner* — Stephen W Smoot
*Assistant Examiner* — Vicki B Booker
(74) *Attorney, Agent, or Firm* — McDermott, Will & Emery LLP

(57) ABSTRACT

A semiconductor light emitting device has a semiconductor laminate including first and second conductivity type semiconductor layers respectively providing first and second main surfaces and an active layer. The semiconductor laminate is divided into first and second regions. At least one contact hole is formed to pass through the active layer from the second main surface of the first region. A first electrode is formed on the second main surface to be connected to the first conductivity type semiconductor layer of the first region and the second conductivity type semiconductor layer of the second region. A second electrode is formed on the second main surface of the first region to be connected to the second conductivity type semiconductor layer of the first region and the first conductivity type semiconductor layer of the second region.

14 Claims, 6 Drawing Sheets

SEMICONDUCTOR LIGHT EMITTING DEVICE WITH CONTACT HOLE PASSING THROUGH ACTIVE LAYER

BACKGROUND OF THE INVENTION

1. Field of the Invention

The present invention relates to a light emitting device, and more particularly, to a semiconductor light emitting device integrated with a protection diode against an electrical discharge such as static electricity.

2. Description of the Related Art

A semiconductor light emitting device is useful in terms of a high output, excellent light efficiency and reliability as a light source, and thus, research into a semiconductor light emitting device capable of being substituted for a backlight in a lighting device or a display device as a high output and a high efficiency light source has been actively undertaken.

In general, a semiconductor light emitting device includes an active layer able to emit light by the recombination of electrons and holes between and together with a p-type semiconductor and an n-type semiconductor. Such semiconductor light emitting devices may be classified according to a position in which an electrode is located to form a semiconductor layer or according to a current path, and although they are not particularly limited, the classification thereof may be determined depending upon whether or not there is electrical conductivity in a substrate mainly used for a semiconductor light emitting device.

For example, when a substrate having electrical insulation is used, mesa etching to form an n-type electrode connected to an n-type semiconductor layer may be required. That is, portions of a p-type semiconductor layer and an active layer are partially removed to expose a portion in an n-type semiconductor layer region, and a p-side electrode and an n-side electrode are respectively formed on a top surface of the p-type semiconductor layer and an exposed top surface of the n-type semiconductor layer.

In the above-mentioned electrode structure, a light emitting area may be reduced during the performing of a mesa etching process and may be formed in a direction perpendicular with regard to current flow, thus it is difficult to promote uniform current distribution throughout an overall area, which may cause a reduction in light emission efficiency.

Meanwhile, when a conductive substrate is used, the conductive substrate may be used as a side electrode. In this semiconductor light emitting device structure, there is little light loss in a light emitting area as compared to the former structure, and a uniform current flow may be comparatively secured herein, whereby light emission efficiency can be enhanced.

However, in a case in which the light emitting device is implemented to have a large area in order to obtain a high output, uniform current distribution is carried out throughout an entire light emitting area by providing an electrode structure such as an electrode finger thereto, but in the case in which the conductive substrate is used, limitations on light extraction due to an electrode provided on a light emission surface or light absorption by the electrode is caused, thus degrading light emission efficiency.

In addition, a semiconductor light emitting device may be exposed to a momentary high voltage such as an electrostatic discharge (ESD) while operating the device, so a function of the device may be damaged.

A design to avoid damage is therefore required. Principally, a scheme in which a specific protection diode is added is considered, but in this case, a separate diode should be packaged and disposed in a single package space, thus causing an obstacle in miniaturizing a product.

SUMMARY OF THE INVENTION

An aspect of the present invention provides a semiconductor light emitting device having a structure in which an ESD protection diode is integrated therewith.

According to an aspect of the present invention, there is provided a semiconductor light emitting device including: a semiconductor laminate including first and second main surfaces opposed to each other, first and second conductivity type semiconductor layers respectively providing the first and second main surfaces, and an active layer formed therebetween, and divided into first and second regions by a separation groove; at least one contact hole formed to pass through the active layer from the second main surface of the first region so as to be connected to one region of the first conductivity type semiconductor layer; a first electrode formed on the second main surface of the semiconductor laminate, connected to the first conductivity type semiconductor layer of the first region through the at least one contact hole, and connected to the second conductivity type semiconductor layer of the second region therethrough; a second electrode formed on the second main surface of the first region and connected to the second conductivity type semiconductor layer of the first region; and an electrode connection unit connecting the second electrode to the first conductivity type semiconductor layer of the second region.

The semiconductor light emitting device may further include a support substrate having electrical conductivity provided to the first main surface of the semiconductor laminate to be connected to the first electrode. In this case, the support substrate may be formed by a plating process. In addition, the semiconductor light emitting device may further include a bonding pad formed on the first conductivity type semiconductor layer of the first region.

The semiconductor light emitting device may further include a support substrate provided on the first main surface of the semiconductor laminate and having first and second electrode lead units respectively connected to the first and second electrodes to be drawn out to the outside.

The second electrode may have a region exposed to the separation groove, and the electrode connection unit may be formed along a side surface of the second region of the semiconductor laminate so as to be connected to an exposed region of the second electrode.

In this case, the semiconductor light emitting device may further include a passivation layer formed on the side surface of the second region of the semiconductor laminate so as to electrically isolate the electrode connection unit from the second region of the semiconductor laminate.

The semiconductor light emitting device may further include an insulative isolation layer formed on the second main surface of the semiconductor laminate and formed to separate the first electrode from the second electrode.

In this case, the insulative isolation layer may extend between an inner side wall of the contact hole and a portion of the first electrode filled in the contact hole.

The first electrode may include a high reflective ohmic contact layer. In this case, the high reflective ohmic contact layer may contain a material selected from the group consisting of Ag, Ni, Al, Rh, Pd, Ir, Ru, Mg, Zn, Pt, Au and a mixture thereof.

The first region of the semiconductor laminate provided as a light emitting region may have an area larger than that of the second region of the semiconductor laminate provided as a protection diode region. In this case, the second region of the semiconductor laminate may have an area equal to 20% or less than that of an entire area of the semiconductor laminate. The at least one contact hole may be provided in plural.

According to another aspect of the present invention, there is provided a semiconductor light emitting device including: a semiconductor laminate including first and second main surfaces opposed to each other, first and second conductivity type semiconductor layers respectively providing the first and second main surfaces, and an active layer formed therebetween, and divided into first and second regions by a separation groove; at least one first contact hole formed to pass through the active layer from the second main surface of the first region so as to be connected to one region of the first conductivity type semiconductor layer; at least one second contact hole formed to pass through the active layer from the second main surface of the second region so as to be connected to one region of the first conductivity type semiconductor layer; a first electrode formed on the second main surface of the semiconductor laminate, connected to the first conductivity type semiconductor layer of the first region through the at least one first contact hole, and connected to the second conductivity type semiconductor layer of the second region therethrough; and a second electrode formed on the second main surface of the semiconductor laminate, connected to the first conductivity type semiconductor layer of the second region through the at least one second contact hole, and connected to the second conductivity type semiconductor layer of the first region therethrough.

The semiconductor light emitting device may further include a support substrate having electrical conductivity provided to the first main surface of the semiconductor laminate to be connected to the second electrode. In this case, the support substrate may be formed by a plating process. In addition, the semiconductor light emitting device may further include a bonding pad formed on the first conductivity type semiconductor layer of the first region, and an electrode connection unit electrically connecting the first electrode to the bonding pad.

The first electrode may have a region exposed to the separation groove, and the electrode connection unit may be formed along a side surface of the second region of the semiconductor laminate so as to be connected to an exposed region of the second electrode.

In this case, the semiconductor light emitting device may further include a passivation layer electrically isolating the electrode connection unit from the side surface of the second region of the semiconductor laminate.

The semiconductor light emitting device may further include an insulative isolation layer formed on the second main surface of the semiconductor laminate and formed to separate the first electrode from the second electrode. In this case, the insulative isolation layer may extend between inner side walls of the first and second contact holes and portions of the first electrode filled in the first and second contact holes.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
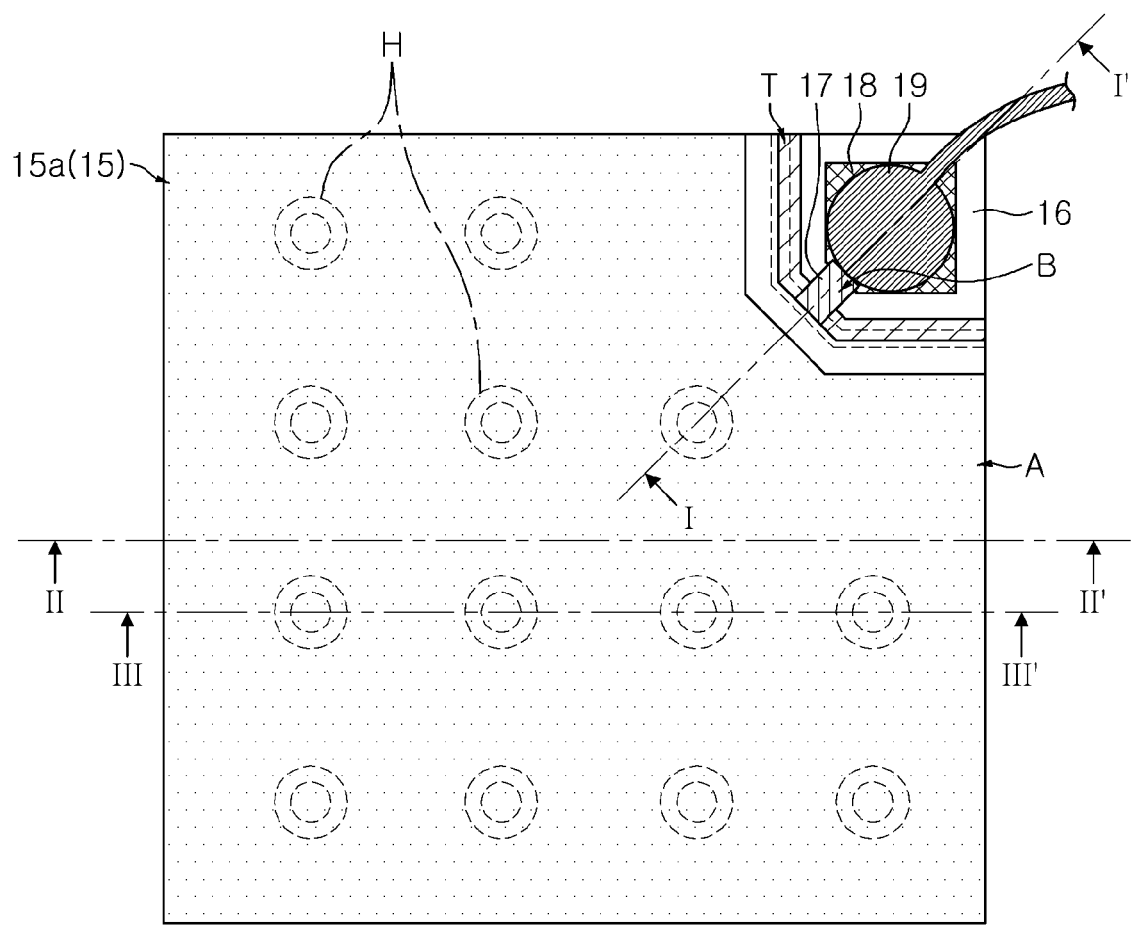
FIG. 1 is a plan view of a semiconductor light emitting device according to a first embodiment of the present invention.

Embodiments of the present invention will now be described in detail with reference to the accompanying drawings such that they could be easily practiced by those having skill in the art to which the present invention pertains. However, in describing the embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of other elements.

Hereinafter, embodiments of the present invention will be described with reference to the accompanying drawings.

Figure 2:
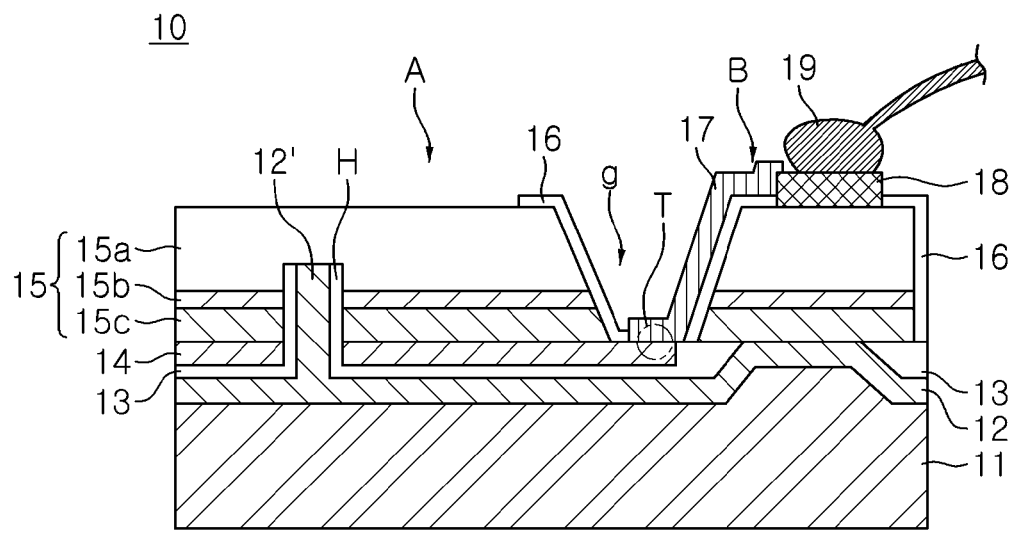
FIG. 2 is a side cross-sectional view of a semiconductor light emitting device taken along line I-I' of FIG. 1.

FIG. 1 is a plan view of a semiconductor light emitting device according to a first embodiment of the present invention. FIG. 2 is a side cross-sectional view of a semiconductor light emitting device taken along line I-I' shown in FIG. 1.

Referring to FIG. 1 together with FIG. 2, a semiconductor light emitting device 10 according to the first embodiment of the present invention may include a semiconductor laminate 15 that includes first and second conductivity type semiconductor layers 15a and 15c, and an active layer 15b positioned therebetween. The semiconductor laminate 15 may have first and second main surfaces respectively provided by the first and second conductivity type semiconductor layers 15a and 15c and positioned to be opposed to each other.

The semiconductor laminate 15 may be a group □-□ compound semiconductor such as a nitride semiconductor, but is not limited thereto. In the present embodiment, the semiconductor laminate 15 may be provided after a separate growth substrate is grown in the sequence of forming the first conductivity type semiconductor layer 15a, the active layer 15b and the second conductivity type semiconductor layer 15c, and may be provided with a wiring structure formed on the first main surface of the semiconductor laminate 15, and a support substrate 11 may be employed therewith.

Here, the support substrate 11 employed in the present embodiment may be a substrate having electrical conductivity, and may be easily provided by a plating process. Subsequently, the growth substrate may be removed from the semiconductor laminate 15 to thus obtain a device structure shown in FIG. 1. In a general case, the first and second conductivity type semiconductor layers 15a and 15c may each be an n-type semiconductor layer and a p-type semiconductor layer.

The semiconductor laminate 15 may be divided into a first region A and a second region B by a separation groove g. The first region A may be provided as a light emitting diode unit driven together with a light emitting diode, and the second region B may be an ESD protection diode unit. In the present embodiment, the second region B may serve as a bonding region for a wire bonding to be connected to an external circuit.

The semiconductor laminate 15 divided into two regions A and B may each operate as the light emitting diode unit and the ESD protection diode unit through a wiring connection described below.

According to the embodiment of the present invention, a second electrode 14 may be formed on the second main surface of the semiconductor laminate 15 to be connected to the second conductivity type semiconductor layer 15c of the first region A.

The second electrode 14 may be a high reflective ohmic contact layer such that light generated from the active layer 15b is reflected. For example, the high reflective ohmic contact layer may be formed of a material selected from the group consisting of Ag, Ni, Al, Rh, Pd, Ir, Ru, Mg, Zn, Pt, Au, and a mixture thereof.

The second main surface of the semiconductor laminate 15 may have a first electrode 12 formed thereon such that the first electrode 12 is connected to the first conductivity type semiconductor layer 15a of the first region A. As described in the present embodiment, a connection between the first electrode 12 and the first conductivity type semiconductor layer 15a of the first region A may be implemented using a contact hole H.

As shown in FIG. 2, in the first region A of the semiconductor laminate 15, at least one contact hole H may be formed to extend from the second main surface of the semiconductor laminate 15 while passing through the second conductivity type semiconductor layer 15c and the active layer 15b until a portion in a region of the first conductivity type semiconductor layer 15a is exposed. The first conductivity type semiconductor layer 15a may be exposed through contact hole H. The first conductivity type semiconductor layer 15a may be exposed through the contact hole H.

The first electrode 12, that is, an electrode unit 12' extending from the first electrode 12, may be connected with an exposed region of the first conductivity type semiconductor layer 15a provided by the contact hole H. Whereby, the first electrode 12 positioned on the second main surface of the semiconductor laminate 15 may be realized in an electrical connection to the first conductivity type semiconductor layer 15a.

The contact hole H may be formed after the semiconductor laminate 15 is formed on the growth substrate, but before the wiring structure is formed thereon. According to the embodiment of the present invention, the contact hole H is shown as having a via form, but may be formed to have a diversity of shapes able to expose a portion in the region of the first conductivity type semiconductor layer 15a.

In the present embodiment, as shown in FIG. 1, a plurality of contact holes H may be formed to be positioned on the first region A, thereby attaining uniform current distribution and being useful for a large area of semiconductor light emitting device for a high level output.

An insulative isolation layer 13 may be formed to easily electrically separate the first electrode 12 from the second electrode 14, which are provided on the second main surface of the semiconductor laminate 15. Such an insulative isolation layer 13 may be formed to extend between an inner side wall of the contact hole H and an electrode part 12' of the first electrode 12.

The first electrode 12 may not only be electrically connected to the first conductivity type semiconductor layer 15a of the first region A, but also to the second conductivity type semiconductor layer 15c of the second region B. Meanwhile, the second electrode 14 connected to the second conductivity type semiconductor layer 15c of the first region A may be electrically connected to the first conductivity type semiconductor layer 15a of the second region B.

As shown in FIG. 2, the second electrode 14 may have an exposed region T extending to be exposed to the outside of the semiconductor laminate 15. The exposed region T may be positioned in the separation groove g as in the present embodiment so as to easily implement a connection thereof with an electrode pad 18 positioned on the second region B.

The second electrode 14 and the electrode pad 18 may be connected to each other through an electrode connection part 17. The electrode connection part 17 may be formed along a side surface of the semiconductor laminate 15 of the second region B, and may be electrically isolated by a passivation layer 16.

Figure 5:
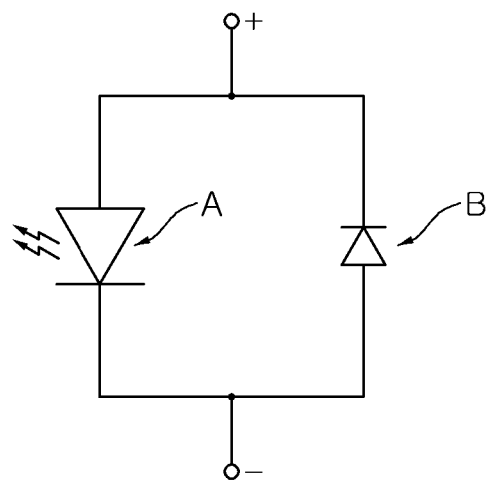
FIG. 5 is an equivalent circuit diagram for explaining the semiconductor light emitting device shown in FIG. 1.

Such an electrode connection may be understood by an equivalent circuit shown in FIG. 5. The first region A may operate as a light emitting diode unit and the second region B may operate as an ESD protection diode.

In the case of the ESD protection diode, which is not conducted due to a reverse voltage applied when the light emitting diode unit operates normally, when a momentary high voltage is generated and a current exceeding a breakdown voltage is conducted, during this process, an excessive current is induced to the ESD protection diode, whereby the light emitting diode unit may be protected.

The support substrate 11 may be provided on the second main surface of the semiconductor laminate 15 to have a wiring structure formed of the first and second electrodes 12 and 14 and the insulative isolation layer 13 therebetween.

The support substrate 11 employed according to the present embodiment may be a substrate having electrical conductivity. The support substrate 11 may be electrically insulated from the second electrode 14 by the insulative isolation layer 13 as shown in FIG. 2, and may be connected to the first electrode 12 to thus be provided as an electrode structure for the first conductivity type semiconductor layer 15a together with the first electrode 12. That is, the support substrate 11 having conductivity may be mounted in an external circuit positioned on a mounting surface of the semiconductor light emitting device 10 so as to be connected thereto.

As described above, the electrode pad 18 connected to the second electrode 14 may be formed on the first conductivity type semiconductor layer 15a of the second region B. A bonding region of the light emitting device 10 may be provided as an upper surface of the second region B, that is, the first main surface opposite to the second main surface.

As such, since the second electrode 14 on the bottom of the separation groove g may be drawn out to the electrode pad 18 positioned on the second region B of the semiconductor laminate 15 through the electrode connection layer 18, a wire bonding unit 19 may be formed on a level approximately equal to the upper surface of the light emitting device 10.

Unlike the present embodiment, in a case in which the bonding region is positioned on the bottom of the separation groove g, an undesired contact with a side surface of a light emission region may occur during a bonding process, or the second electrode and/or the insulation layer, a passivation layer, may be damaged by a thermal or mechanical shock during the bonding process while causing defects in the connection. The occurrence of a defect may be prevented through a bonding connection structure according to the present embodiment.

Since the first region A of the semiconductor laminate 15 may be provided as a light emission region, the first region A may be provided to have a larger area than the second region B provided as the protection diode unit and the bonding region. The second region B of the semiconductor laminate 15 may have an area equal to 20% or less with regard to an entire area of the semiconductor laminate 15.

The light emitting device 10 may further include the passivation layer 16 formed of an insulation material at least formed on the side surface of the semiconductor laminate 16 as shown in FIG. 2.

Figure 3:
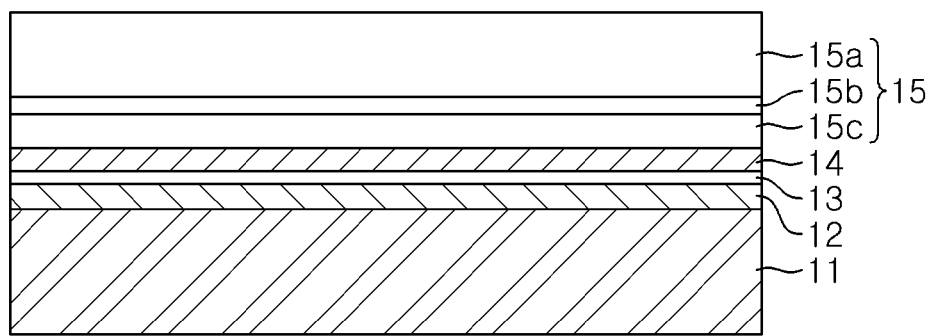
FIG. 3 is a side cross-sectional view of the semiconductor light emitting device taken along line II-II' of FIG. 1.
Figure 4:
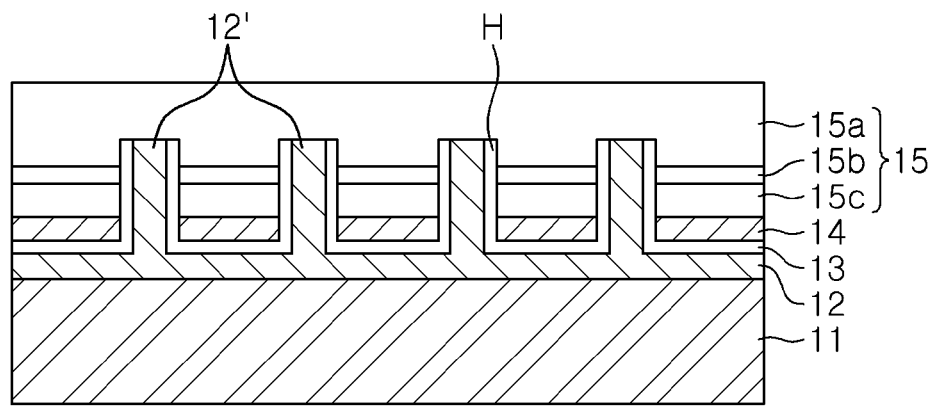
FIG. 4 is a side cross-sectional view taken along line III-III' of FIG. 1.

A side cross-sectional view of the semiconductor light emitting device 10 taken along line II-II' of FIG. 1 is illustrated in FIG. 3, and a side cross-sectional view taken along line III-III' of FIG. 1 is illustrated in FIG. 4.

Referring to FIG. 3, the light emitting device 10 is shown to have a stacked state in which the first electrode 12, the insulative isolation layer 13, the second electrode 14, the semiconductor laminate 15 are formed in sequence on the support substrate 11 having electrical conductivity.

Meanwhile, with reference to FIG. 4, the light emitting device 10 may have a stacked state in which the first electrode 12, the insulative isolation layer 13, the second electrode 14, the semiconductor laminate 15 are formed in sequence on the support substrate 11 similarly to FIG. 3, except in a region in which a hole is formed However, in the light emitting device 10 according to an embodiment of the invention, current distribution characteristics may be increased by forming a plurality of contact holes H to be arrayed at constant intervals, and a structure in which the first electrode 12 can directly contact the first conductivity type semiconductor layer 15a may be provided.

In the light emitting device according to the present embodiment, the first and second electrodes 12 and 14, each directly connected to the first and second conductivity type semiconductor layers 15a and 15c, may be provided on one surface, that is, on the second main surface, but in a final external circuit connection, a first contact structure connected to the first conductivity type semiconductor layer 15a of the light emitting diode region A may be formed in a second main surface direction through the support substrate 11. Further, a second contact structure connected to the second conductivity type semiconductor layer 15c of the light emitting diode region A may be formed in a first main surface direction, opposed to the second main surface.

In a second embodiment of the present invention, contrary to the above case, in the case of the final external circuit connection, a first contact structure connected to the first conductivity type semiconductor layer of the light emitting diode region A may be formed in the first main surface direction, and a second contact structure connected to the second conductivity type semiconductor layer of the light emitting diode region A may be formed through the support substrate positioned on the second main surface.

Figure 6:
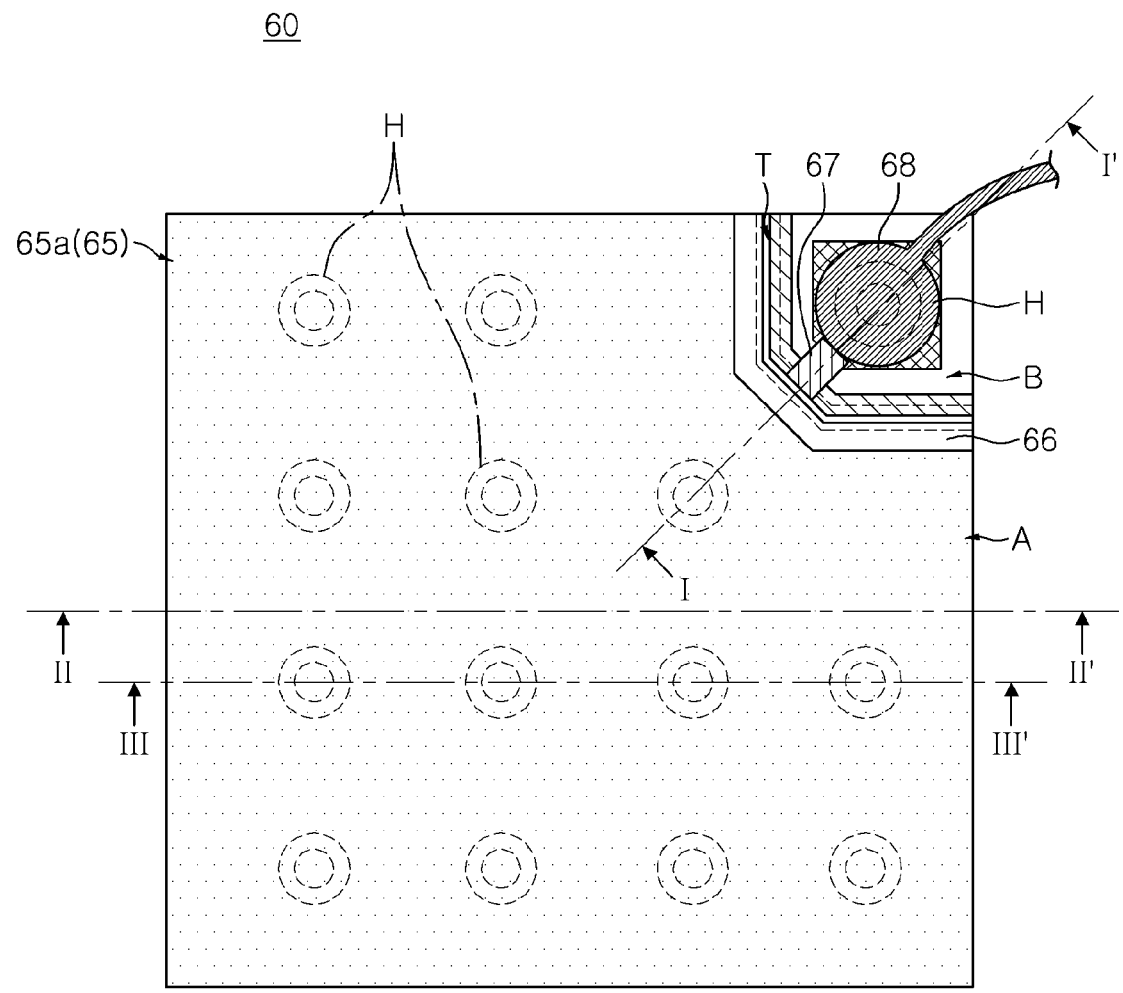
FIG. 6 is a plan view of a semiconductor light emitting device according to a second embodiment of the present invention.
Figure 7:
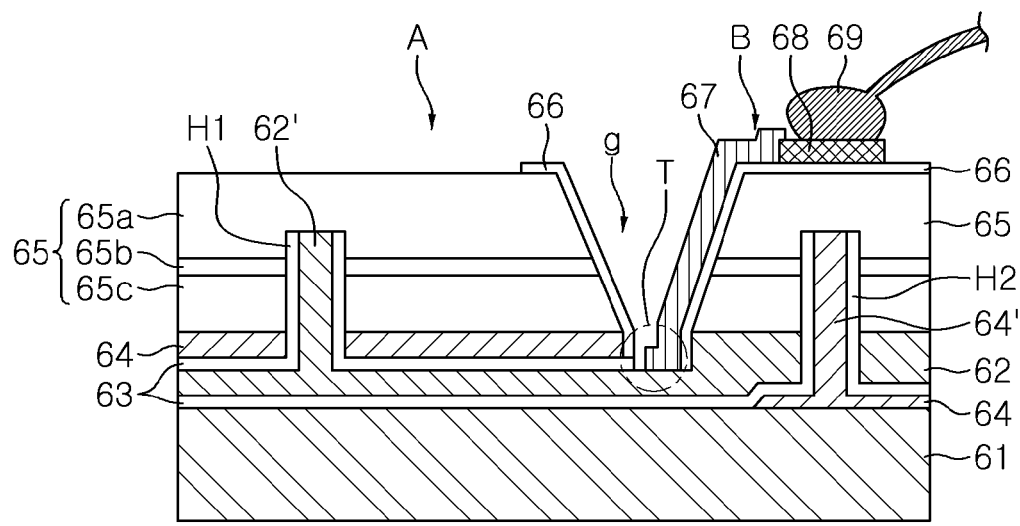
FIG. 7 is a side cross-sectional view of the semiconductor light emitting device taken along line I-I' of FIG. 6.

FIG. 6 is a plan view of a semiconductor light emitting device according to a second embodiment of the present invention. FIG. 7 is a side cross-sectional view of the semiconductor light emitting device taken along line I-I' of FIG. 6.

Referring to FIG. 6 together with FIG. 7, a semiconductor light emitting device 60 according to the second embodiment may include a semiconductor laminate 65 having first and second conductivity type semiconductor layers 65a and 65c and an active layer 65b formed therebetween. The semiconductor laminate 65 may include first and second main surfaces respectively provided by the first and second conductivity type semiconductor layers 65a and 65c and opposed to each other.

A support substrate 61 employed in the present embodiment may be a substrate having an electrical conductivity, and may be easily provided by a plating process. In a general case, the first and second conductivity type semiconductor layers 65a and 65c may respectively be n-type and p-type semiconductor layers.

Similarly to the above-mentioned first embodiment, the semiconductor laminate 65 may be divided into a first region A and a second region B by a separation groove g. The first region A may be provided as a light emitting diode unit driven together with a light emitting diode, and the second region B may be an ESD protection diode unit. In the present embodiment, the second region B may serve as a bonding region for a wire bonding to be connected to an external circuit.

The semiconductor laminate 65 divided into two regions A and B may implement a connection between the light emitting diode unit and the ESD protection diode unit through a wiring connection different from that in the foregoing embodiment, as shown in an equivalent circuit of FIG. 5.

As shown in FIG. 7, the semiconductor light emitting device 60 may include first and second contact holes H1 and H2 respectively formed in the first and second regions A and B. The first and second contact holes H1 and H2 may each be formed to pass through the active layer from the second main surface such that they are connected to one region of the first conductivity type semiconductor layer 65a. The first and second contact holes H1 and H2 may respectively be formed in plural. For example, as in the present embodiment, the first contact hole H1 formed in the first region A may be formed in plural, for example, 12 contact holes, in order to obtain a uniform current distribution in a relatively wide light emission area, and the second contact hole H2 may be only formed as one contact hole in consideration of a relatively small region.

The first electrode 62 may be formed on the second main surface of the semiconductor laminate 65 and connected with the first conductivity type semiconductor layer 65a of the first region A and the second conductivity type semiconductor layer 65c of the second region B. As shown in FIG. 7, a connection between the first electrode 62 and the first conductivity type semiconductor layer 65a of the first region A may be realized through the contact hole H. That is, an electrode unit 62', extending from the first electrode 62, may be coupled to an exposed region of the first conductivity type semiconductor layer 65a provided through the contact hole H, thereby implementing the connection between the first electrode 62 and the first conductivity type semiconductor layer 65a of the first region A.

The second electrode 64 may be formed on the second main surface of the second laminate 65 and connected with the second conductivity type semiconductor layer 65c of the first region A and the first conductivity type semiconductor layer 65a of the second region B. As shown in FIG. 7, a connection between the second electrode 64 and the first conductivity type semiconductor layer 65a of the second region B may be realized using the contact hole H. That is, an electrode unit 64' extending from the second electrode 64 may be coupled to an exposed region of the first conductivity type semiconductor layer 65a provided through the contact hole H, thereby implementing the connection between the second electrode 64 and the first conductivity type semiconductor layer 65a of the second region B.

An insulative isolation layer 63 may be formed to easily electrically separate the first electrode 62 from the second electrode 64, both of which are provided on the same second main surface of the semiconductor laminate 65. Such insulative isolation layer 63 may be formed to extend between inner side walls of the first and second contact holes H1 and H2 and an electrode unit 62' of the first electrode 62.

Further, as shown in FIG. 7, the first electrode 62 may have an exposed region T extending to be exposed to the outside of the semiconductor laminate 65. The exposed region T may be positioned in the separation groove g in the case of the present embodiment.

In the present embodiment, an electrode pad 69 may be formed on the second region B similarly to the form shown in FIG. 2, but unlike the form shown in FIG. 2, the electrode pad may be prevented from being connected to the first conductivity type semiconductor layer 65a of the second region B by a passivation layer 66.

The exposed region of the first electrode 62 and the electrode pad 68 may be connected to each other through an electrode connection unit 67. The electrode connection part 67 may be formed along a side surface of the semiconductor laminate 65 of the second region B and may be electrically isolated by the passivation layer 66.

As such, a connection between the light emitting diode region A and the protection diode region may be implemented through the above-mentioned electrode connection like the equivalent circuit of FIG. 5.

The support substrate 61 may be provided on the second main surface of the semiconductor laminate 65 to have a wiring structure formed of the first and second electrodes 62 and 64 with the insulative isolation layer 63 therebetween.

The support substrate 61 employed according to the present embodiment may be a substrate having electrical conductivity. The support substrate 61 may be electrically insulated from the first electrode 62 by the insulative isolation layer 63 as shown in FIG. 7, and may be connected to the second electrode 64 to be thus provided as an electrode structure for the second conductivity type semiconductor layer 65c, together with the second electrode 64.

That is, the support substrate 61 having conductivity may be mounted in an external circuit positioned on a mounting surface of the semiconductor light emitting device 60 so as to be connected thereto.

As in the foregoing description, the electrode pad 68 connected to the second electrode 64 may be formed on the first conductivity type semiconductor layer 65a of the second region B. Also, the first conductivity type semiconductor layer 65a may be insulated from the electrode pad 68 by the passivation layer 66.

Whereby, the bonding region of the light emitting device 60 may be provided as an upper surface of the second region B, that is, the first main surface opposite to the second main surface. In addition, as described above, since the first electrode 62 on the bottom of the separation groove g may be connected to the electrode pad 68 positioned on the second region B of the semiconductor laminate 65 by using the electrode connection layer 68, a wire bonding unit 69 may be formed on a level approximately the same as the upper surface of the light emitting device 60.

Figure 8:
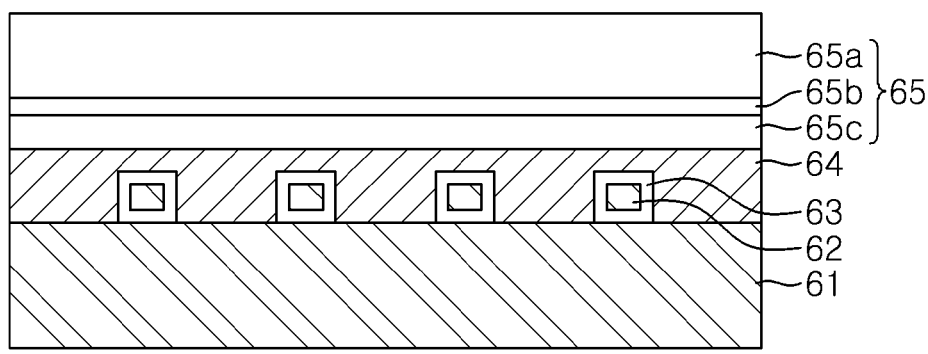
FIG. 8 is a side cross-sectional view of the semiconductor light emitting device taken along line II-II' of FIG. 6.
Figure 9:
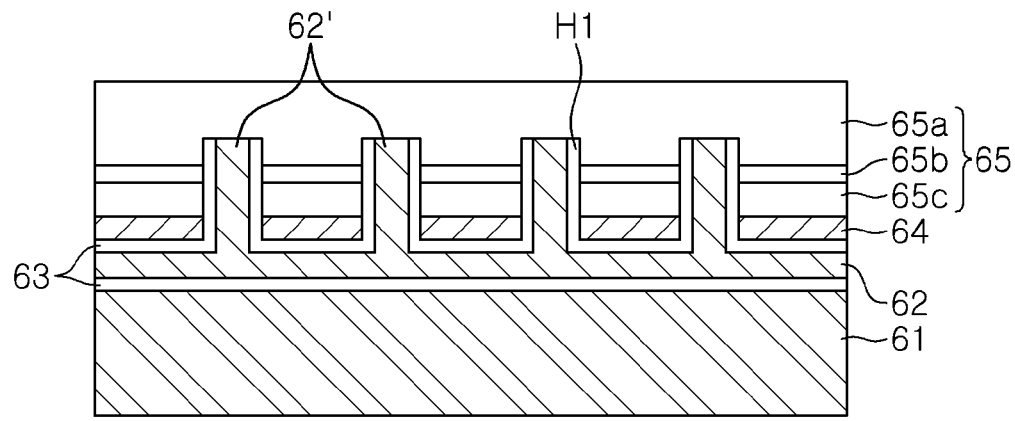
FIG. 9 is a side cross-sectional view of the semiconductor light emitting device taken along line III-III' of FIG. 6.

FIG. 8 is a side cross-sectional view of the semiconductor light emitting device 60 taken along line II-II' of FIG. 6. FIG. 9 is a side cross-sectional view of the semiconductor light emitting device 60 taken along line III-III' of FIG. 6.

Referring to FIG. 8, the light emitting device 60 may have a stacked state in which the second electrode 64 and the semiconductor laminate 65 are stacked in sequence on the support substrate 61 having electrical conductivity. The first electrode 62 shown in FIG. 8 may be a portion having a coupling in the first contact hole and may be surrounded by the insulative isolation layer 63 to be electrically insulated from the second electrode.

Meanwhile, with reference to FIG. 9, the light emitting device 60 may have a stacked state in which the first electrode 62, the second electrode 64 and the semiconductor laminate 65 are formed in sequence on the support substrate 61, except in a region in which a hole is formed. The first electrode 62 may have a portion 62' extending through the first contact hole H1 and may be connected to the first conductivity type semiconductor layer 65a therethrough. Similarly to the description with reference to FIG. 8, the first electrode 62 may insulate the second electrode 64 from the support substrate 61 through the insulative isolation layer 63.

As such, according to the present embodiment, in a final external circuit connection, a first contact structure connected to the first conductivity type semiconductor layer 65a of the light emitting diode region A may be formed in the direction of the first main surface, an upper part of the device. Further, a second contact structure connected to the second conductivity type semiconductor layer 65c of the light emitting diode region A may be formed through the support substrate 61 positioned on the second main surface.

Figure 10:
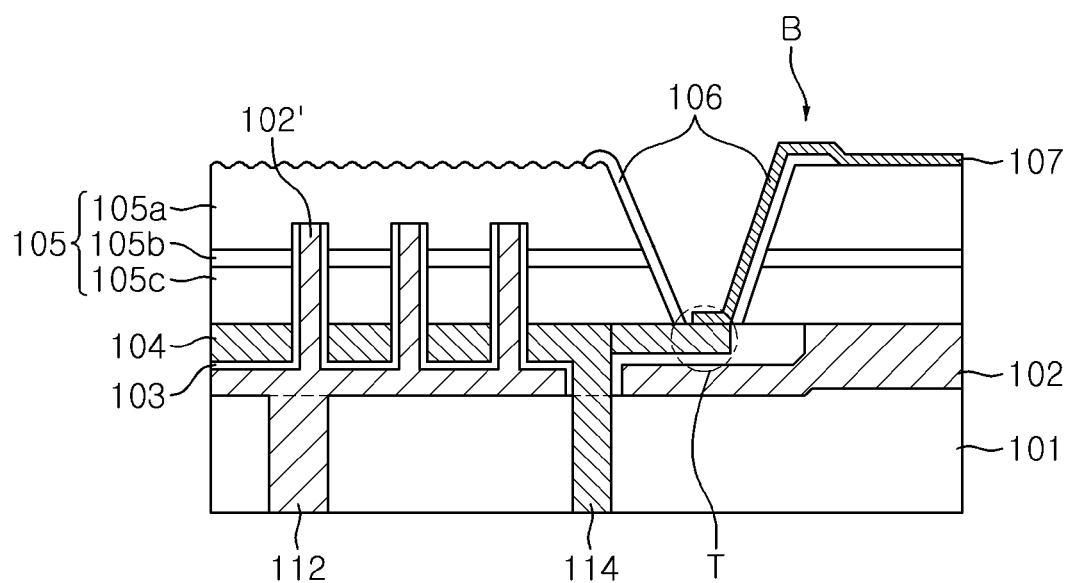
FIG. 10 is a side cross-sectional view of a semiconductor light emitting device according to another embodiment of the present invention.

FIG. 10 is a side cross-sectional view of a semiconductor light emitting device according to another embodiment of the present invention.

With reference to FIG. 10, a semiconductor light emitting device 100 according to the present embodiment may include a semiconductor laminate 105 having first and second conductivity type semiconductor layers 105a and 105c and an active layer 105b positioned therebetween. The semiconductor laminate 105 may have first and second main surfaces provided by the first and second conductivity type semiconductor layers 105a and 105c and opposed to each other.

The semiconductor laminate 105 may be divided into a first region A and a second region B by a separation groove g. The first region A may be provided as a light emitting diode unit driven together with a light emitting diode, and the second region B may be provided as an ESD protection diode unit. In the present embodiment, the second region B may serve as a bonding region for a wire bonding to be connected to an external circuit.

In the present embodiment, the second electrode 104 may be formed on the second main surface of the semiconductor laminate 105 so as to be connected to the second semiconductor layer 105c of the first region A. The first electrode 102 connected to the first conductivity type semiconductor layer 105a of the first region A may be provided on the second main surface of the semiconductor laminate 105. As in the present embodiment, the first electrode 102 may be connected to the first conductivity type semiconductor layer 105a of the first region A by using the contact hole H.

As shown in FIG. 10, in the first region A of the semiconductor laminate 105, at least one contact hole H may be formed to extend from the second main surface while passing through the second conductivity type semiconductor layer 105c and the active layer 105b until a portion in the first conductivity type semiconductor layer (105a) region is exposed. The first conductivity type semiconductor layer 105a may be exposed through the contact hole H.

The first electrode 102 may be coupled with the exposed region of the first conductivity type semiconductor layer 105a provided by the contact hole H through an electrode unit 102' extending from the first electrode 102. Whereby, the first electrode 102 positioned on the second main surface may be realized in an electrical connection with the first conductivity type semiconductor layer 105*a*.

An insulative isolation layer 103 may be formed to easily electrically separate the first electrode 102 from the second electrode 104, which are provided on the second main surface of the semiconductor laminate 105. An insulative isolation layer 103 may be formed to extend between an inner side wall of the contact hole H and an electrode unit 102' of the first electrode 102.

As such, the first electrode 102 may be electrically connected to not only the first conductivity type semiconductor layer 105*a* of the first region A but also the second conductivity type semiconductor layer 105*c* of the second region B. Meanwhile, the second electrode 104 connected to the second conductivity type semiconductor layer 105*c* of the first region A may be also electrically connected to the first conductivity type semiconductor layer 105*a* of the second region B.

In addition, the second electrode 104 may have an exposed region T extending to be exposed to the outside of the semiconductor laminate 105. The exposed region T may be positioned in the separation groove g as in the present embodiments so as to easily implement a connection of the second electrode 104 to the first conductivity type semiconductor layer 105*a* of the second region B.

As shown in FIG. 10, the second electrode 104 may be connected to the electrode pad 108 through an electrode connection unit 107. The electrode connection unit 107 may be formed along a side surface of the semiconductor laminate 105 of the second region B and electrically insulated by a passivation layer 106.

The support substrate 101 may be provided on the second main surface of the semiconductor laminate 105 to have a wiring structure formed of the first and second electrodes 102 and 104 and the insulative isolation layer 103 therebetween.

The support substrate 101 employed in the present embodiment may be an insulating substrate and may include first and second electrode lead units 112 and 114 respectively connected to the first and second electrodes 102 and 104 to be drawn out to the outside. In this structure, the contact structure coupled to the respective first and second conductivity type semiconductor layers 105*a* and 105*c* of the light emitting diode region A may have a form in which it is drawn out downwardly of the support substrate 101 overall.

As described above, the form in which an electrode connection to an external circuit by using a support substrate having first and second electrode lead units is implemented on the support substrate, will be able to be realized by combining the form with the forms shown in FIGS. 6 and 7 instead of an electrode pad structure.

As set forth above, according to embodiments of the present invention, a scheme of implementing an ESD protection diode to be integrated with a light emitting diode in a new semiconductor light emitting structure may be provided. The light emitting diode may be implemented to be integrated with the ESD protection diode. Further, an electrode is not formed on a semiconductor layer surface, a light emission surface, but a contact hole may be formed in an opposite surface thereto to thus improvement schemes able to significantly increase light emission efficiency such that a light emitting area can be significantly increased. Moreover, a plurality of contact holes may be employed to be distributed in appropriate positions, thereby promoting relatively high efficiency in current distribution, even across a large area.

In a specific embodiment, an ESD protection diode may be provided as a bonding region, thereby reducing defects, for example, a defect such as a short occurring due to damage to an insulation layer from shocks at the time of a wire bonding.

While the present invention has been shown and described in connection with the embodiments in the embodiments, it will be apparent to those skilled in the art that modifications and variations can be made without departing from the spirit and scope of the invention as defined by the appended claims.

What is claimed is:

1. A semiconductor light emitting device comprising:
a semiconductor laminate including first and second main surfaces opposed to each other, first and second conductivity type semiconductor layers respectively providing the first and second main surfaces, and an active layer formed therebetween, and divided into first and second regions by a separation groove;
at least one contact hole formed to pass through the active layer from the second main surface of the first region so as to be connected to one region of the first conductivity type semiconductor layer;
a first electrode formed on the second main surface of the semiconductor laminate, connected to the first conductivity type semiconductor layer of the first region through the at least one contact hole, and connected to the second conductivity type semiconductor layer of the second region therethrough;
a second electrode formed on the second main surface of the first region and connected to the second conductivity type semiconductor layer of the first region; and
an electrode connection unit connecting the second electrode to the first conductivity type semiconductor layer of the second region,
wherein the surface of the first electrode, facing the second main surface, has a portion bent toward the second main surface so as to contact the second conductivity type semiconductor layer of the second region.

2. The device of claim 1, further comprising a support substrate having electrical conductivity provided to the second main surface of the semiconductor laminate to be connected to the first electrode.

3. The device of claim 2, wherein the support substrate is formed by a plating process.

4. The device of claim 2, further comprising an electrode pad formed on the first conductivity type semiconductor layer of the first region.

5. The device of claim 1, further comprising a support substrate provided on the first main surface of the semiconductor laminate and having first and second electrode lead units respectively connected to the first and second electrodes to be drawn out to the outside.

6. The device of claim 1, wherein the second electrode has a region exposed to the separation groove, and the electrode connection unit is formed along a side surface of the second region of the semiconductor laminate so as to be connected to an exposed region of the second electrode.

7. The device of claim 6, further comprising a passivation layer formed on the side surface of the second region of the semiconductor laminate so as to electrically isolate the electrode connection unit from the second region of the semiconductor laminate.

8. The device of claim 1, further comprising an insulative isolation layer formed on the second main surface of the semiconductor laminate and formed to separate the first electrode from the second electrode.

9. The device of claim 8, wherein the insulative isolation layer extends between an inner side wall of the contact hole and a portion of a first electrode filled in the contact hole.

10. The device of claim 1, wherein the first electrode includes a reflective ohmic contact layer.

11. The device of claim 10, wherein the reflective ohmic contact layer contains a material selected from the group consisting of Ag, Ni, Al, Rh, Pd, Ir, Ru, Mg, Zn, Pt, Au, and a mixture thereof.

12. The device of claim 1, wherein the at least one contact hole is provided in plural.

13. The device of claim 1, wherein the first region of the semiconductor laminate has an area larger than that of the second region of the semiconductor laminate.

14. The device of claim 13, wherein the second region of the semiconductor laminate has an area equal to 20% or less than that of an entire area of the semiconductor laminate.

* * * * *